United States Patent
Miura

(10) Patent No.: US 8,319,304 B2
(45) Date of Patent: Nov. 27, 2012

(54) LIGHT DETECTING APPARATUS

(75) Inventor: Noriyuki Miura, Miyagi (JP)

(73) Assignee: Lapis Semiconductor Co., Ltd. (JP)

( * ) Notice: Subject to any disclaimer, the term of this patent is extended or adjusted under 35 U.S.C. 154(b) by 186 days.

(21) Appl. No.: 12/951,700

(22) Filed: Nov. 22, 2010

(65) Prior Publication Data

US 2011/0140223 A1    Jun. 16, 2011

(30) Foreign Application Priority Data

Dec. 11, 2009   (JP) ................................ 2009-281879

(51) Int. Cl.
     *H01L 21/0232* (2006.01)
(52) U.S. Cl. ........................... 257/435; 257/431; 438/25
(58) Field of Classification Search .................. 257/431, 257/435, E31.113; 438/25–28
See application file for complete search history.

(56) References Cited

U.S. PATENT DOCUMENTS

| 7,429,099 | B2 * | 9/2008 | Sugimoto et al. | 347/68 |
| 8,013,342 | B2 * | 9/2011 | Bernstein et al. | 257/74 |

FOREIGN PATENT DOCUMENTS

JP    2006-156465 A    6/2006
JP    2007-066976 A    3/2007

* cited by examiner

*Primary Examiner* — Phuc Dang
(74) *Attorney, Agent, or Firm* — Studebaker & Brackett PC; Donald R. Studebaker

(57) ABSTRACT

A light detecting apparatus includes an SOI substrate. In the SOI substrate, a semiconductor layer and a silicon substrate are laminated via an insulating layer. The semiconductor layer has a light receiving unit and a circuit unit formed therein. The light detecting apparatus also includes an interlayer insulating film formed on a first main surface of the SOI substrate. The light detecting apparatus also includes a front surface circuit wiring embedded in the interlayer insulating film. The light detecting apparatus also includes a front surface pseudo-wiring having a grid unit. The grid unit has at least one opening allowing passage of a light of a predetermined wavelength range to the light receiving unit. The light detecting apparatus also includes a rear surface circuit wiring and a rear surface pseudo-wiring formed on a second main surface of the SOI substrate. The light detecting apparatus also includes a penetration circuit wiring that connects the front surface circuit wiring to the rear surface circuit wiring. The light detecting apparatus also includes a penetration pseudo-wiring that electrically connects the front surface pseudo-wiring to the rear surface pseudo-wiring. The light receiving unit is surrounded by the front surface pseudo-wiring, the rear surface pseudo-wiring, and the penetration pseudo-wiring.

19 Claims, 5 Drawing Sheets

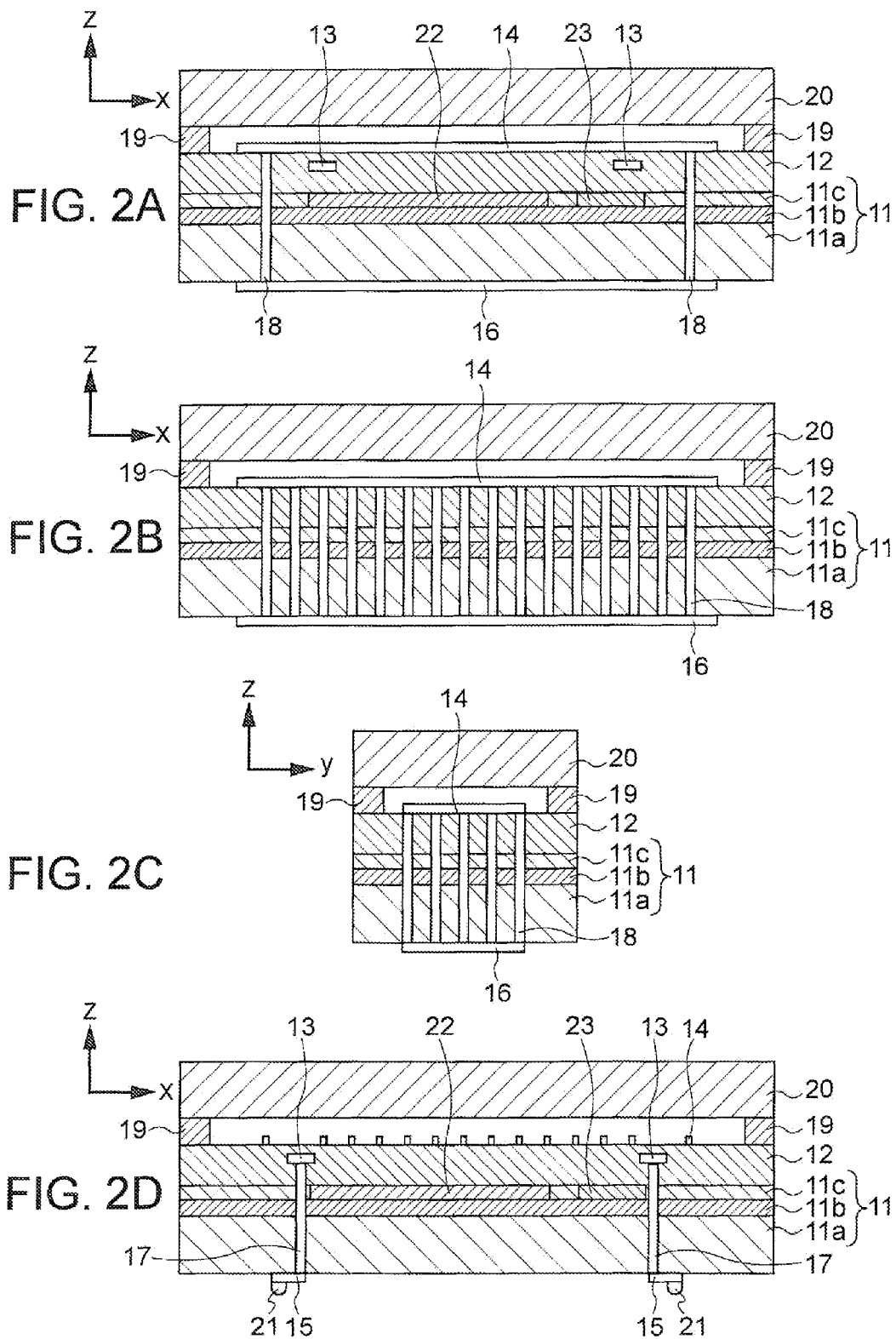

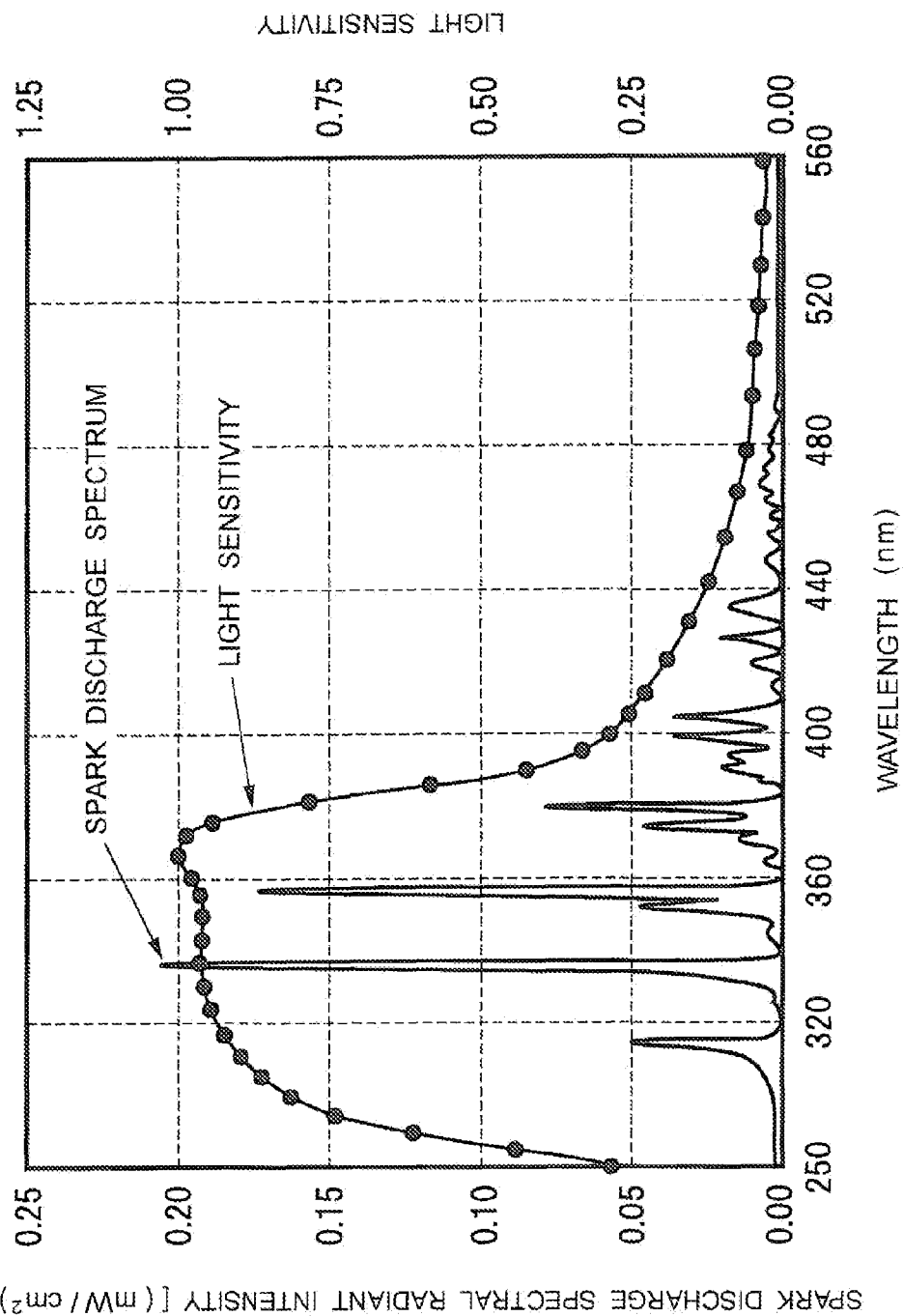

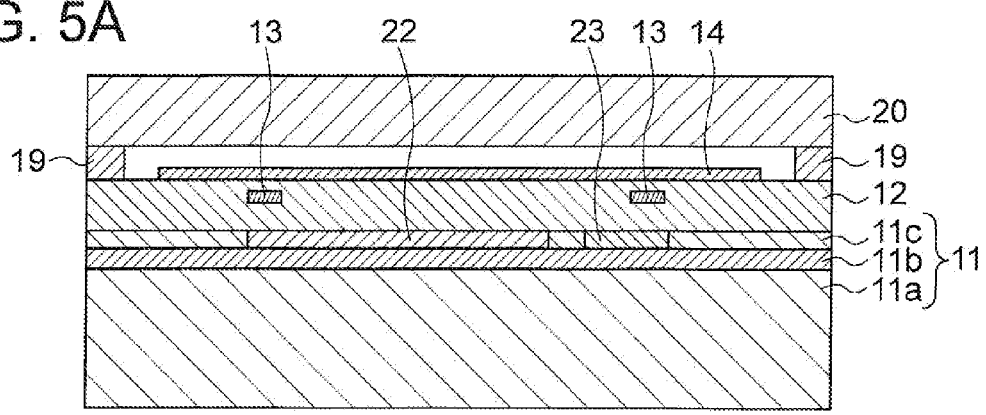
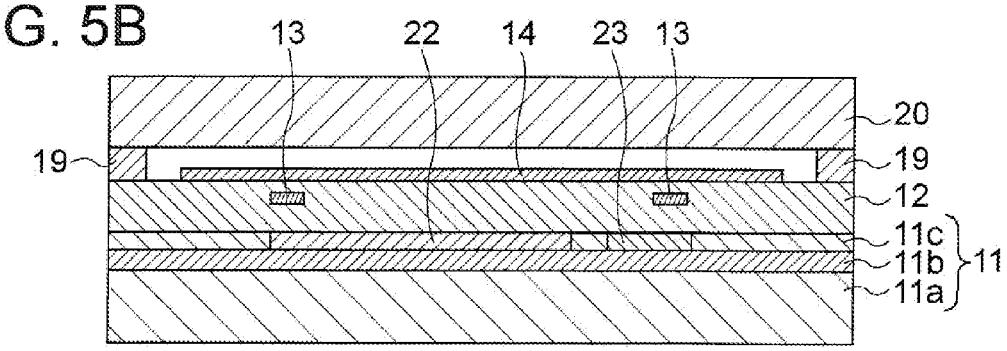
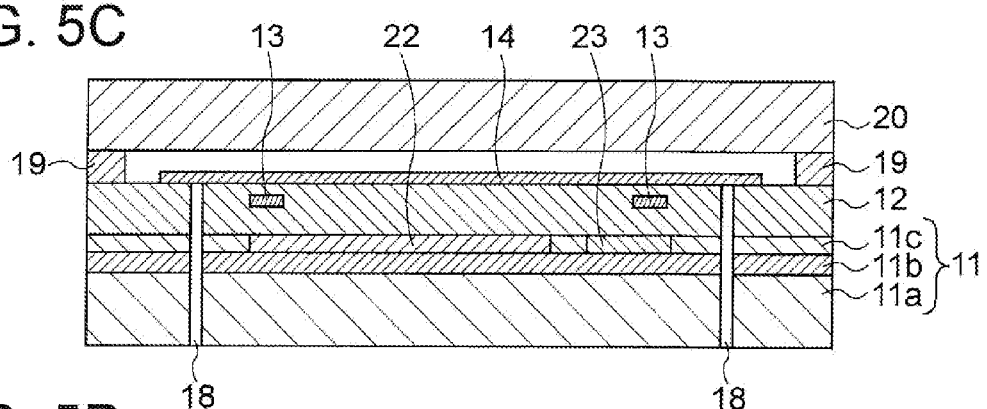
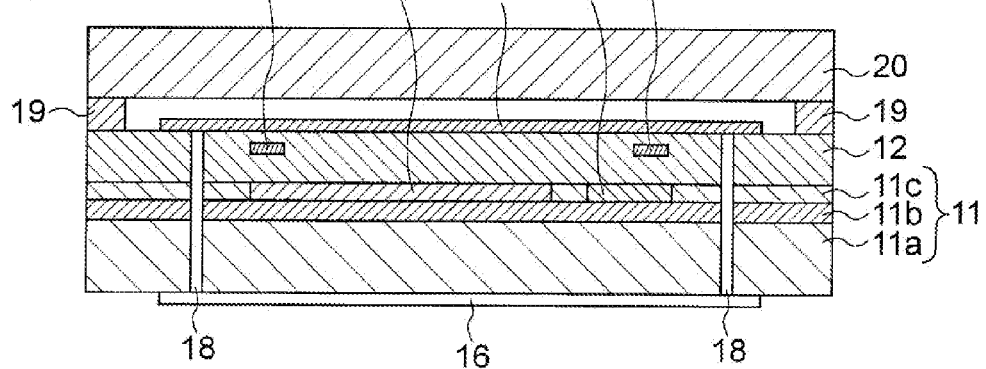

LIGHT DETECTING APPARATUS

BACKGROUND OF THE INVENTION

The present invention generally relates to a light detecting apparatus, and more particularly to a light detecting apparatus that can detect ultraviolet light. The present invention also relates to a method of manufacturing such light detecting apparatus.

In recent years, many tall apartments are built and many elderly people live alone. From the standpoint of fire plan, it is desired to install a fire alarm that is capable of quickly detecting a fire with high sensitivity in the housing. Particularly, fire prevention measures are necessary for electric plugs of home appliances. In Japan, the disposition of a fire alarm in a new residential housing is obliged by the revised Fire Defense Law since June, 2006.

SUMMARY OF THE INVENTION

A typical fire alarm detects smoke and heat, and raises the alarm when the smoke and heat reach a certain level. Thus, the conventional fire alarm is unable to detect a fire unless the fire spreads to a certain range. In other words, the fire alarm has difficulty in detecting a fire at an early stage. Also, it is extremely difficult for the typical fire alarm to detect a fire (i.e., to detect smoke and heat) at an early state if the fire occurs outside the house.

One approach for solving these problems includes detecting light emitted from a spark generated from an electric plug. Since ultraviolet light is generated upon the spark discharge (tracking discharge), a conventional spark detector has a light sensitivity only to a wavelength range of the ultraviolet light. The spark detector has a light receiving unit made of diamond or GaN with a wide bandgap. For example, Japanese Patent Application Publication (Kokai) No. 2006-156465 and No. 2007-66976 disclose a diamond ultraviolet sensor. This sensor has a diamond semiconductor that is used as a light receiving unit.

However, a spark detector having a light receiving unit made of diamond, etc., has difficulty in terms of downsizing. In particular, it is difficult to integrate the light receiving unit with peripheral circuitry that drives the light receiving unit, into one chip. As a result, the light receiving unit must be mounted on a board substrate made of silicon, etc. Therefore, it is difficult to make the spark detector smaller than a board substrate size. Also, wirings for connecting the light receiving unit with the peripheral circuits are elongated and the wirings act as an antenna. Consequently, the spark detector receives electromagnetic radiation noise (EMI: Electro Magnetic Interference). This leads to malfunctioning of the spark detector.

One object of the present invention is to provide a light detecting apparatus that can achieve downsizing and preventing a malfunction due to EMI.

Another object of the present invention is to provide a method of manufacturing a light detecting apparatus that can achieve downsizing and prevent a malfunction due to EMI.

According to a first aspect of the present invention, there is provided a light detecting apparatus that includes an SOI substrate. In the SOI substrate, a semiconductor layer and a silicon substrate are laminated via an insulating layer. The semiconductor layer has a light receiving unit and a circuit unit formed therein. The light detecting apparatus also includes an interlayer insulating film formed on a first major surface of the SOI substrate. The light detecting apparatus also includes a front surface circuit wiring connected to the light receiving unit or to the circuit unit. The front surface circuit wiring is embedded in the interlayer insulating film. The light detecting apparatus also includes a front surface pseudo-wiring formed on (or in) the interlayer insulating film. The front surface pseudo-wiring includes a grid unit that has at least one opening. The opening(s) allow(s) passage of a light of a predetermined wavelength range to the light receiving unit. The light detecting apparatus also includes a rear surface circuit wiring and a rear surface pseudo-wiring formed on (or in) a second major surface of the SOI substrate. The light detecting apparatus also includes a penetration circuit wiring that penetrates the SOI substrate to connect the front surface circuit wiring to the rear surface circuit wiring. The light detecting apparatus also includes a penetration pseudo-wiring that penetrates at least the SOI substrate to electrically connect the front surface pseudo-wiring to the rear surface pseudo-wiring. The light receiving unit is circumferentially surrounded by the front surface pseudo-wiring, the rear surface pseudo-wiring, and the penetration pseudo-wiring.

Since the light detecting apparatus allows the light receiving unit to transmit a light of a predetermined wavelength range therethrough and circumferentially surrounds the light receiving unit with a plurality of pseudo-wirings, EMI-caused malfunctions can be suppressed (or prevented) without deteriorating light sensitivity of the light detecting apparatus.

Since the light detecting apparatus has the light receiving unit and circuit unit formed within the same SOI substrate, downsizing and cost reduction are easily achievable.

According to a second aspect of the present invention, there is provided a method of manufacturing a light detecting apparatus. The manufacturing method includes the step of preparing an SOI substrate. In the SOI substrate, a semiconductor layer and a silicon substrate are laminated via an insulating layer. The silicon substrate has a light receiving unit and a circuit unit formed thereon. The manufacturing method also includes the step of forming an interlayer insulating film on top of a first major surface of the SOI substrate. The manufacturing method also includes the step of embedding a front surface circuit wiring in the interlayer insulating film. The manufacturing method also includes the step of forming a front surface pseudo-wiring on top of the interlayer insulating film. The front surface pseudo-wiring has a grid unit. The grid unit has at least one opening that allow passage of a light in a predetermined wavelength range to the light receiving unit. The manufacturing method also includes the step of forming a penetration circuit wiring that reaches the front surface circuit wiring from a second major surface of the SOI substrate. The manufacturing method also includes the step of forming a penetration pseudo-wiring that penetrates at least the SOI substrate from the second major surface of the SOI substrate. The penetration pseudo-wiring is electrically connected to the front surface pseudo-wiring. The manufacturing method also includes the step of forming on top of the second major surface of the SOI substrate a rear surface circuit wiring connected to the front surface circuit wiring and a rear surface pseudo-wiring connected to the front surface pseudo-wiring. The light receiving unit is circumferentially surrounded by the front surface pseudo-wiring, the rear surface pseudo-wiring, and the penetration pseudo-wiring.

Since the light detecting apparatus made by this manufacturing method allows the light receiving unit to transmit a light of a predetermined wavelength range therethrough and circumferentially surrounds the light receiving unit with a plurality of pseudo-wirings, EMI-caused malfunctions can be suppressed (or prevented) without deteriorating light receiving sensitivity. Since the light detecting apparatus obtained by this manufacturing method has the light receiving unit and circuit unit formed within the same SOI substrate, downsizing and cost reduction are achievable.

The method of manufacturing a light detecting apparatus may include:

preparing an SOI substrate that has a semiconductor layer and a silicon substrate laminated via an insulating layer, said semiconductor layer having a light receiving unit and a circuit unit formed therein;

forming an interlayer insulating film on top of a first main surface of the SOI substrate;

embedding a front surface circuit wiring in the interlayer insulating film;

forming a front surface pseudo-wiring on top of the interlayer insulating film, said front surface pseudo-wiring having a grid unit that defines at least one opening allowing passage of a light in a predetermined wavelength range to the light receiving unit;

forming a penetration circuit wiring that reaches the front surface circuit wiring from a second main surface of the SOI substrate;

forming a penetration pseudo-wiring that penetrates at least the SOI substrate from the second main surface of the SOI substrate such that the penetration pseudo-wiring be electrically connected to the front surface pseudo-wiring; and forming on top of the second main surface of the SOI substrate a rear surface circuit wiring connected to the front surface circuit wiring and a rear surface pseudo-wiring connected to the front surface pseudo-wiring, wherein the light receiving unit is surrounded by the front surface pseudo-wiring, the rear surface pseudo-wiring, and the penetration pseudo-wiring.

The predetermined wavelength range may include an ultraviolet light range.

The front surface pseudo-wiring may further include a light blocking unit that blocks the light of the predetermined wavelength range to the circuit unit.

The penetration pseudo-wiring may further penetrate the interlayer insulating film.

The method of manufacturing a light detecting apparatus may further include:

forming a sealing unit disposed on top of the interlayer insulating film to surround the front surface pseudo-wiring; and bonding a transparent substrate to the sealing unit.

These and other objects, aspects and advantages of the present invention will become apparent to those skilled in the art when the following detailed description is read and understood in conjunction with the appended claims and drawings.

BRIEF DESCRIPTION OF THE DRAWINGS

FIG. 2A is a cross-sectional view taken along the line 2A-2A in FIG. 1A;

FIG. 2B is a cross-sectional view taken along the line 2B-2B in FIG. 1A;

FIG. 2C is a cross-sectional view taken along the line 2C-2C in FIG. 1A;

FIG. 2D is a cross-sectional view taken along the line 2D-2D in FIG. 1B;

FIG. 3 is a graph showing a relationship between light sensitivity and wavelength and a relationship between spark discharge spectral radiant intensity and wavelength of the light detecting apparatus shown in FIG. 1A; and FIGS. 4A to 4D and 5A to 5D are a series of cross-sectional views that are useful to explain a process of manufacturing the light detecting apparatus shown in FIG. 1A.

DETAILED DESCRIPTION OF THE INVENTION

Exemplary embodiments of the present invention will now be described in detail with reference to the accompanying drawings.

Figure 1A:
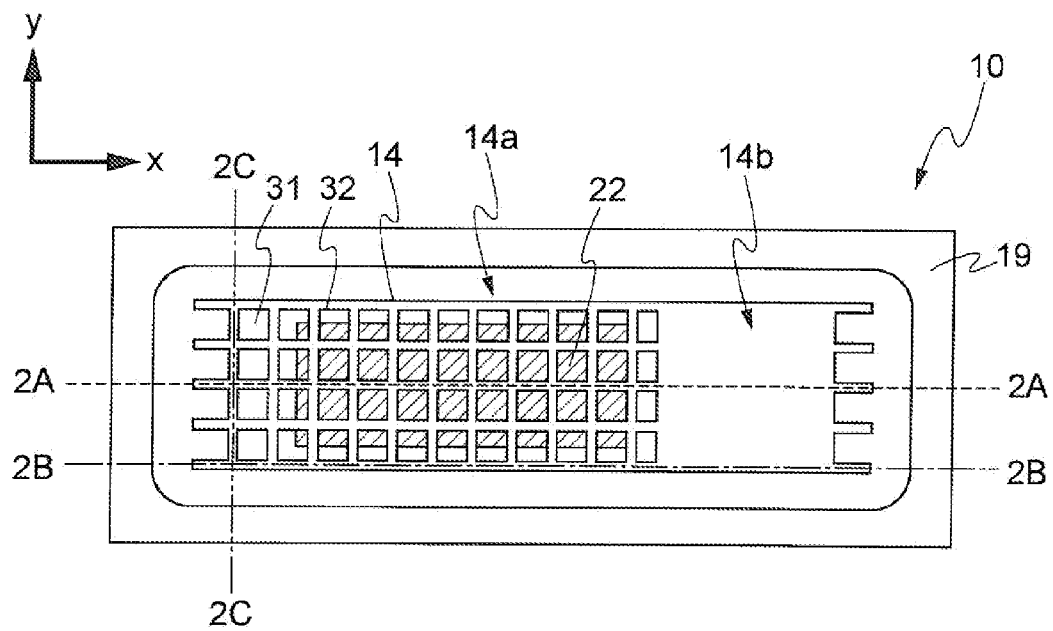
FIG. 1A is a plan view of a light detecting apparatus according to an embodiment of the present invention.
Figure 1B:
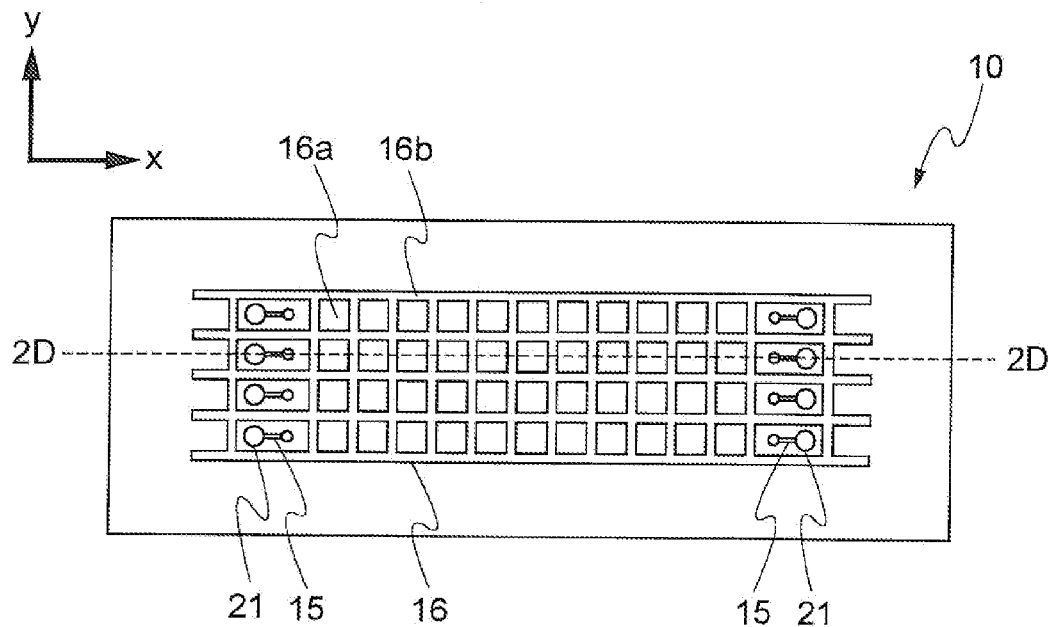
FIG. 1B is a bottom view of the light detecting apparatus shown in FIG. 1A.

A structure of a light detecting apparatus 10 of the present invention will first be described with reference to FIGS. 1A, 1B, and FIGS. 2A to 2D. FIG. 1A is a top view of the light detecting apparatus 10 and FIG. 1B is a bottom view of the light detecting apparatus 10. FIG. 2A to FIG. 2D are cross-sectional views. The long side direction, the short side direction, and the height direction of the light detecting apparatus are defined as x-direction, y-direction, and z-direction, respectively.

As depicted in FIGS. 1A, 1B, and FIGS. 2A to 2D, the light detecting apparatus 10 includes an SOI (silicon on insulator) substrate 11, an interlayer insulating film 12, a first front surface wiring (front surface circuit wiring) 13, a second front surface wiring (front surface pseudo-wiring) 14, a first rear surface wiring (rear surface circuit wiring) 15, a second rear surface wiring (rear surface pseudo-wiring) 16, a first penetration wiring (penetration circuit wiring) 17, second penetration wirings (penetration pseudo-wirings) 18, a sealing unit 19, a transparent substrate 20, and external terminals 21.

The SOI substrate 11 has a three-layer structure including a silicon substrate 11a, an embedded oxidized film layer 11b, and an SOI layer 11c. A light receiving unit 22, i.e., a photodiode, and a circuit unit 23 including an operational amplifier, etc., are provided in a predetermined area of the SOI layer 11c. Thus, a surface of the SOI layer 11c acts as a light receiving surface. The SOI layer 11c has a layer thickness of about 30 nm. This layer thickness enables the light detecting apparatus 10 to detect ultraviolet (UV) in the range of 250 nm to 400 nm generated at the time of spark discharge.

On the front surface of the SOI substrate 11 (on a first major surface), the interlayer insulating film 12 made of $SiO_2$ is formed. The first front surface wiring 13 made of Al or Cu is embedded in the interlayer insulating film 12. The first front surface wiring 13 is a wiring for connecting the light receiving unit 22 to the circuit unit 23 or a wiring for signal outputting from the circuit unit 23.

The second front surface wiring 14 made of Al or Cu is formed on the interlayer insulating film 12. As depicted in FIG. 1A, the second front surface wiring 14 has a grid unit 14a and a light blocking unit 14b that blocks light incoming from the outside. The grid unit 14a has a plurality of opening portions 31 and a wiring portion 32. The grid unit 14a is disposed above the light receiving unit 22, and the light blocking unit 14b is disposed above the circuit unit 23. This arrangement enables light of a predetermined wavelength range to be transmitted through the opening portions 31 only to the light receiving unit 22 from the outside and suppresses occurrence of noise due to transmission of the light of the predetermined wavelength range to the circuit unit 23. Consequently, this arrangement enables (realizes) highly accurate light detection. The second front surface wiring 14 is a pseudo wiring (dummy wiring), which is not electrically connected to the light receiving unit 22 and the circuit unit 23 formed in the SOI layer 11c. The dimensions of the opening portions 31 are set to block electron radiation noise from the outside (not to transmit electromagnetic waves). It should be noted that the second front surface wiring 14 may entirely be formed into a grid shape without providing the light blocking unit 14*b*. In this case, a light blocking unit blocking light from the outside may be disposed on the transparent substrate 20.

On the rear surface of the SOI substrate 11 (on a second major surface), the first rear surface wiring 15 and the second rear surface wiring 16 made of Al or Cu are formed. The external terminals 21 are formed at one end of the first rear surface wiring 15 and the first penetration wiring 17 is connected to the other end of the first rear surface wiring 15. The second rear surface wiring 16 is formed into a grid shape and is made up of opening portions 16*a* and a wiring portion 16*b*. In the opening portions 16*a* located at both ends in the y-direction, the first rear surface wiring 15 and the external terminals 21 are disposed. Like the second front surface wiring 14, the second rear surface wiring 16 is a pseudo wiring, which is not electrically connected to the light receiving unit 22 and the circuit unit 23 formed in the SOI layer 11*c*. The dimensions of the opening portions 16*a* are set so as to block the electron radiation noise from the outside (not to transmit electromagnetic waves).

In the SOI substrate 11 and the interlayer insulating film 12, the first penetration wiring 17 is formed, penetrating the SOI substrate 11 and the interlayer insulating film 12 to electrically connect the first front surface wiring 13 with the first rear surface wiring 15. In the SOI substrate 11 and the interlayer insulating film 12, the second penetration wirings 18 are formed, penetrating the SOI substrate 11 and the interlayer insulating film 12 to connect the second front surface wiring 14 with the second rear surface wiring 16. The second penetration wirings 18 have a column shape. The first penetration wiring 17, the light receiving unit 22, and the circuit unit 23 are surrounded by the second penetration wirings 18 in the x-y cross sectional view. The second penetration wirings 18 are arranged at appropriate intervals to block the external radiation noise coming toward the light detecting apparatus 10 from the outside. The second penetration wirings 18 extend parallel to each other between the second front surface wiring 14 and the second rear surface wiring 16 such that the second penetration wirings 18 connect the edge portions of the second front surface wiring 14 to the edge portions of the second rear surface wiring 16. Like the second front surface wiring 14, the second penetration wirings 18 are pseudo wirings, which are not electrically connected to the light receiving unit 22 and the circuit unit 23 formed in the SOI layer 11*c*.

Although the second penetration wirings 18 are formed into a column (or post) shape in this embodiment, the second penetration wirings 18 may be formed into a wall shape to surround the light receiving unit 22 and the circuit unit 23 in the x-y cross sectional view without gap. By forming the second penetration wirings 18 into such wall shape, the external radiation noise directed to the light detecting apparatus 10 from the outside can be blocked more efficiently.

It should also be noted that the second penetration wirings 18 may be configured to penetrate only the SOI substrate 11. In this configuration, the second front surface wiring 14, the second rear surface wiring 16, and the second penetration wirings 18 may be connected to a ground potential. The second front surface wiring 14 may electrically be connected to the second rear surface wiring 16 via the second penetration wirings 18 and its outside extension (additional wiring extending from the second penetration wirings 18 out of the light detecting apparatus 10). It is only necessary to make the second rear surface wiring 16 and the second penetration wirings 18 equipotential.

The sealing unit 19 made of adhesive resin is formed at an edge portion on the front surface of the interlayer insulating film 12. The sealing unit 19 is disposed to surround the second front surface wiring 14. Since the sealing unit 19 is disposed at such location, light is directly made incident on the light receiving unit 22 without passing through the sealing unit 19. This suppresses drop of UV transmittance due to the deterioration of ultraviolet light passing through the sealing unit 19, and achieves the light detection with higher accuracy.

The transparent substrate 20 made of UV transmitting glass is bonded to the interlayer insulating film 12 via the sealing unit 19. The transparent substrate 20 is attached so as not to contact the second front surface wiring 14. A desired space is formed by the interlayer insulating film 12, the sealing unit 19, and the transparent substrate 20. This space is filled with an ambient gas such as air or nitrogen.

With the above-described structure, the light receiving unit 22 is surrounded by the second front surface wiring 14 disposed on the first major surface side of the SOI substrate 11 (on the side having the transparent substrate 20), the second rear surface wiring 16 disposed on the second major surface side of the SOI substrate 11, and the second penetration wirings 18 penetrating the SOI substrate 11. Thus the light detecting apparatus 10 has a configuration with the light receiving unit 22 being surrounded by the second front surface wiring 14, the second rear surface wiring 16, and the second penetration wirings 18 in the x-, y- and z-directions. Since the light receiving unit 22 is surrounded by the above-mentioned metal material, the light detecting apparatus 10 has an electrostatic shielding effect. The light detecting apparatus 10 can receive the light of the predetermined wavelength range through the opening portions 31 of the grid-shaped second front surface wiring 14 and achieve the electrostatic shielding with the second front surface wiring 14, the second rear surface wiring 16 and the second penetration wirings 18. Therefore, the light detecting apparatus 10 can efficiently achieve the electrostatic shielding without deteriorating the light sensitivity.

Since the first penetration wiring 17 is surrounded by the second penetration wirings 18 (i.e., the first penetration wiring is located in an area defined by the second penetration wirings 18), the influence of the electromagnetic radiation noise (EMI: Electro Magnetic Interference) is reduced in the first penetration wiring 17. Thus, it is possible to reduce the effect of noise on an electric signal supplied from the circuit unit 23 to the outside.

Since the light detecting apparatus 10 includes the light receiving unit 22 having a photodiode made of the same material (silicon) as the circuit unit 23, and the light receiving unit 22 and the circuit unit 23 are formed within the SOI layer 11*c*, the light detecting apparatus 10 has a structure integrated into one chip. By integrating into one chip in this way, the chip size can be reduced from the conventional order of a few cm to the order of a few mm. Since the length of wirings in the light detecting apparatus 10 can be 1/10 of the length of wirings on a conventional printed substrate, the light detecting apparatus 10 is smaller (or compact) than a conventional light detecting apparatus and has fewer EMI-caused malfunctions.

It should be noted that the diffusion of Al or Cu may be prevented by coating the wirings made of Al or Cu with barrier metal films made of Ti or Ti/Ni.

An ability of detecting ultraviolet of 250 nm to 400 nm with the light detecting apparatus 10 will be described with reference to FIG. 3.

The graph of FIG. 3 shows a relationship between spark discharge spectral radiant intensity and wavelength and also shows a relationship between light (receiving) sensitivity and wavelength of the light detecting apparatus 10. The horizontal axis of the graph indicates wavelength (nm). The left vertical axis of the graph indicates spark discharge spectral radiant intensity [(mW/cm$^2$)/nm] and the right vertical axis indicates light (receiving) sensitivity. The unit of light (receiving) sensitivity is an arbitrary unit using a peak value as a reference value (i.e., 1).

As depicted in FIG. 3, a spark discharge spectrum has a plurality of steep peaks in a wavelength range of about 300 nm to 380 nm. The light generated at the time of spark discharge is ultraviolet having a wavelength of about 300 nm to 380 nm. As can be seen from the curve of the light sensitivity, the light detecting apparatus 10 has relatively high light sensitivity in a range of about 250 nm to about 400 nm and particularly high light sensitivity in a range of about 300 nm to about 380 nm. When comparing the curve of the spark discharge spectrum with the curve of the light sensitivity, it is known that the peak ranges of both the curves are substantially identical. This means that the light detecting apparatus 10 can highly accurately detect the ultraviolet generated at the time of spark discharge. Accordingly the sparks causing a fire in an electric plug can highly accurately be detected.

As described above, by setting the layer thickness of the SOI layer 11c to about 30 nm, the light sensitivity characteristic depicted in FIG. 3 can be acquired in the light detecting apparatus 10. This is because the optical absorption spectrum in the SOI layer 11c is dependent on the thickness of the SOI layer 11c. Therefore, by appropriately changing (selecting) the thickness of the SOI layer 11c, the light in a desired wavelength range (e.g., light including the ultraviolet light range, light from the infrared light range to the ultraviolet light range, and light from the ultraviolet light to the visible light range) can be detected.

Since the light detecting apparatus 10 can detect a spark by adjusting the thickness of the SOI layer 11c without using an optical filter, the downsizing and the cost reduction of the light detecting apparatus 10 can easily be achieved.

A manufacturing method of the light detecting apparatus 10 will be described with reference to FIGS. 4A to 4D and FIGS. 5A to 5D. FIGS. 4A to 4D and FIGS. 5A to 5D are a series of cross-sectional views that in combination illustrate an exemplary method of manufacturing the light detecting apparatus 10.

Figure 4A:
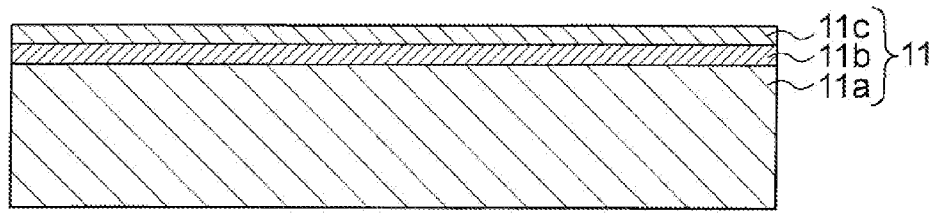

The SOI substrate 11 is first prepared that has a structure with the silicon substrate 11a, the embedded oxidized film layer 11b, and the SOI layer 11c laminated (FIG. 4A). In the illustrated embodiment, the SOI layer 11c has a layer thickness of about 30 nm. For example, the SOI substrate 11 may be manufactured through a laminating method or a SIMOX (Silicon Implanted Oxide) method. In the case of the laminating method, a silicon wafer with a SiO$_2$ film formed on its surface is bonded to another silicon wafer (without a SiO$_2$ film) through thermal compression bonding and one of the silicon wafers is ground and removed to manufacture the SOI substrate 11. On the other hand, in the case of the SIMOX method, high-energy high-concentration oxygen is ion-implanted from a surface of a prime wafer, and the implanted oxygen and silicon are reacted by a subsequent heat treatment to form the embedded oxidized film layer 11b having the SiO$_2$ film in an inner part near the prime wafer surface. This creates the SOI substrate 11. In this embodiment, the SOI substrate 11 is then etched until the layer thickness of the SOI layer 11c becomes about 30 nm.

Figure 4B:
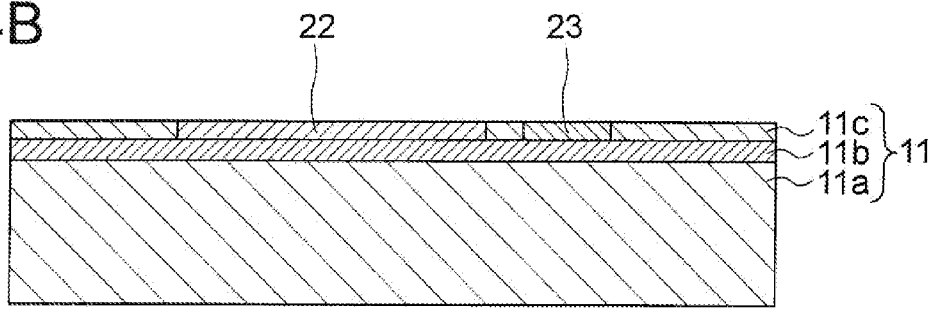

A well-known semiconductor device manufacturing technique such as ion implantation is used to form the circuit unit 23 made up of the light receiving unit 22, the operational amplifier, etc., within the SOI layer 11c (FIG. 4B). The light receiving unit 22 is a photodiode.

Figure 4C:
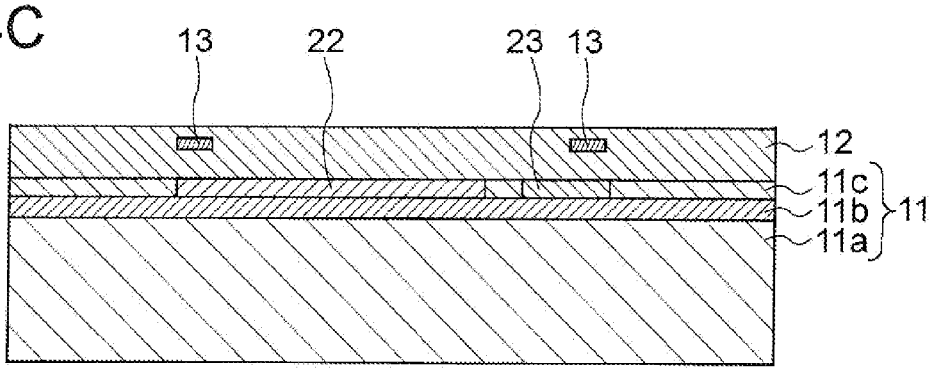

A known film formation technique such as chemical vapor deposition (CVD) method is used to form the interlayer insulating film 12 on the SOI layer 11c, and a known film formation technique such as a sputtering method is used to form the first front surface wiring 13 within the interlayer insulating film 12 (FIG. 4C). More specifically, first, SiO$_2$ having a desired thickness is deposited on the SOI layer 11c through the CVD method. Photolithography and the sputtering method are then used to form the first front surface wiring 13 on the deposited SiO$_2$. SiO$_2$ is further deposited through the CVD method to cover the first front surface wiring 13. As a result, the interlayer insulating film 12 is formed with the first front surface wiring 13 included therein. It should be noted that the first front surface wiring 13 may be given a multilayer structure by repeating the above-described process.

Figure 4D:
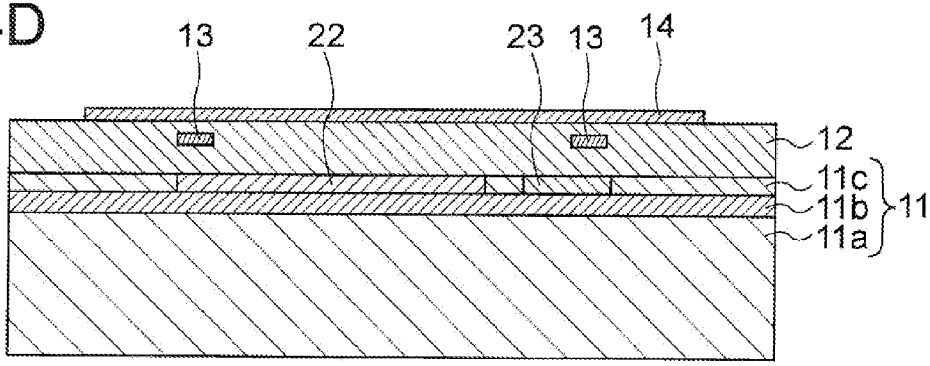

The second front surface wiring 14 is formed on the interlayer insulating film 12 (FIG. 4D). More specifically, first, a resist is applied to cover the interlayer insulating film 12. The resist is then patterned through photolithography. The patterned resist is used as a mask to deposit Cu or Al through the sputtering method. The resist is removed to form the second front surface wiring 14 having a desired shape. Since the second front surface wiring 14 is made up of the grid unit 14a and the light blocking unit 14b as depicted in FIG. 1A in this embodiment, the resist is patterned such that the resist has openings corresponding to the grid unit 14a and the light blocking unit 14b.

An adhesive is applied onto the interlayer insulating film 12 such that the second front surface wiring 14 is surrounded by the adhesive to form the sealing unit 19. The transparent substrate 20 is subsequently affixed to the sealing unit 19. At this step, the transparent substrate 20 is affixed so as not to contact the second front surface wiring 14. This provides (creates) a desired space surrounded by the interlayer insulating film 12, the sealing unit 19, and the transparent substrate 20. The sealing is thus provided (FIG. 5A). It should be noted that the space may be filled with nitrogen by executing the process of affixing the transparent substrate 20 in nitrogen atmosphere.

The silicon substrate 11a is ground to change the thickness of the SOI substrate 11 to a predetermined thickness (FIG. 5B). This enables the downsizing of the light detecting apparatus 10 and the reduction of formation times of the first and second penetration wirings 18 (will be described later).

The first penetration wiring 17 is provided that reaches the first front surface wiring 13 from the rear surface of the SOI substrate 11, i.e., the second major surface, and the second penetration wirings 18 are provided that reach the second front surface wiring 14 from the second major surface (FIG. 5C).

More specifically, first, a resist is applied to cover the rear surface of the SOI substrate 11. The resist is patterned through photolithography. The patterned resist is used as a mask to perform etching so as to form through-holes (not depicted) reaching the first front surface wiring 13 from the rear surface of the SOI substrate 11. The resist is removed and a new resist is applied to cover the rear surface of the SOI substrate 11. The new resist is patterned through photolithography. The patterned resist is used as a mask to perform etching. This etching creates through-holes (not depicted) reaching the second front surface wiring 14 from the rear surface of the SOI substrate 11. The through holes are filled with Cu or Al through the sputtering method to form the first penetration wiring 17 and the second penetration wirings 18. It should be noted that prior to being filled with Cu or Al, Ti or Ti/Ni may be deposited on the side surfaces (side walls) of the through-holes to form the barrier metal films.

The first rear surface wirings 15 and the second rear surface wiring 16 are formed on the rear surface of the SOI substrate 11. The external terminals 21 are formed on the first rear surface wirings 15 (FIG. 5D). More specifically, first, a resist is applied to cover the rear surface of the SOI substrate 11. The resist is patterned through photolithography. The patterned resist is used as a mask to deposit Cu or Al through the sputtering method. The resist is removed to form the first rear surface wirings 15 and the second rear surface wiring 16. One solder ball is mounted on one end of each first rear surface wiring 15. Thus, all the first rear surface wirings 15 have the external terminals 21, respectively.

A wafer tape is affixed to the transparent substrate 20 and dicing is performed for segmentation. Thus, a plurality of light detecting apparatus 10, each having a chip size, are provided. The manufacturing of the light detecting apparatus 10 is completed through the above-described process.

According to the manufacturing method of the above-described embodiment, the light receiving unit 22 and the circuit unit 23 can be formed in the SOI substrate 11. Thus, the downsizing and the cost reduction of the light detecting apparatus 10 is achieved. Since the wirings connecting the light receiving unit 22 with the circuit unit 23 can be made shorter than the conventional arrangement, the light detecting apparatus 10 can be manufactured that has reduced malfunctions due to the effect of EMI reduced. Since a wafer level chip size package (W-CSP) technique is used to circumferentially surround the light receiving unit 22 with the second front surface wiring 14, the second rear surface wiring 16, and the second penetration wirings 18 in the manufacturing method of the embodiment, the light detecting apparatus 10 can be manufactured with sufficient electrostatic shielding.

If the second penetration wirings 18 penetrate only the SOI substrate 11, the manufacturing method may include an additional process for connecting the second front surface wiring 14, the second rear surface wiring 16, and the second penetration wirings 18 to the ground potential. Further, another process may be provided to electrically connect the second front surface wiring 14 to the second rear surface wiring 16 via the second penetration wirings 18 and its extension (i.e., a wiring extending out of the light detecting apparatus 10 from the second penetration wirings 18).

As described above, according to the above-described light detecting apparatus and manufacturing method, the light detecting apparatus 10 has a configuration allowing the light receiving unit 22 to transmit a light of a predetermined wavelength range therethrough and circumferentially surrounding the light receiving unit 22 with a plurality of pseudo-wirings (the second front surface wiring 14, the second rear surface wiring 16, and the second penetration wirings 18). Therefore, EMI-caused malfunctions can be suppressed or eliminated without deteriorating light sensitivity. In addition, since the light detecting apparatus 10 has a configuration with the light receiving unit 22 and the circuit unit 23 formed within the same SOI substrate 11, downsizing and cost reduction are easily achievable.

This application is based on Japanese Patent Application No. 2009-281879 filed on Dec. 11, 2009 and the entire disclosure thereof is incorporated herein by reference.

What is claimed is:

1. A light detecting apparatus comprising:
 an SOI substrate that has a semiconductor layer and a silicon substrate laminated via an insulating layer, said semiconductor layer having a light receiving unit and a circuit unit formed therein, said SOI substrate having a first main surface and a second main surface;
 an interlayer insulating film formed on top of the first main surface of the SOI substrate;
 a front surface circuit wiring connected to the light receiving unit or the circuit unit, the front surface circuit wiring being embedded in the interlayer insulating film;
 a front surface pseudo-wiring formed on the interlayer insulating film, the front surface pseudo-wiring having a grid unit that defines an opening allowing passage of a light of a predetermined wavelength range to the light receiving unit;
 a rear surface circuit wiring provided on top of the second main surface of the SOI substrate;
 a rear surface pseudo-wiring provided on top of the second main surface of the SOI substrate;
 a penetration circuit wiring that penetrates the SOI substrate to connect the front surface circuit wiring to the rear surface circuit wiring; and
 a penetration pseudo-wiring that penetrates at least the SOI substrate to electrically connect the front surface pseudo-wiring to the rear surface pseudo-wiring, wherein the light receiving unit is surrounded by the front surface pseudo-wiring, the rear surface pseudo-wiring, and the penetration pseudo-wiring.

2. The light detecting apparatus of claim 1, wherein the predetermined wavelength range includes an ultraviolet light range.

3. The light detecting apparatus of claim 2, wherein the front surface pseudo-wiring further includes a light blocking unit that blocks the light of the predetermined wavelength range.

4. The light detecting apparatus of claim 2, wherein the penetration pseudo-wiring further penetrates the interlayer insulating film.

5. The light detecting apparatus of claim 3, wherein the penetration pseudo-wiring has a plurality of column-shaped wirings disposed at intervals sufficient to block electromagnetic radiation noises coming from the outside.

6. The light detecting apparatus of claim 3, wherein the penetration pseudo-wiring has a wall-shaped wiring disposed to block electromagnetic radiation noise coming from the outside.

7. The light detecting apparatus of claim 3, wherein the penetration pseudo-wiring connects edge portions of the front surface pseudo-wiring to corresponding edge portions of the rear surface pseudo-wiring.

8. The light detecting apparatus of claim 3, wherein the penetration circuit wiring is surrounded by the penetration pseudo-wiring.

9. The light detecting apparatus of claim 3 further comprising a sealing unit disposed on the interlayer insulating film to surround the front surface pseudo-wiring, and a transparent substrate bonded to the sealing unit.

10. The light detecting apparatus of claim 3, wherein a layer thickness of the semiconductor layer is about 30 nm.

11. The light detecting apparatus of claim 1, wherein the front surface circuit wiring is made from Al or Cu.

12. The light detecting apparatus of claim 11 further comprising a first barrier metal film that covers the front surface circuit wiring.

13. The light detecting apparatus of claim 12, wherein the first barrier metal film is made from Ti or TiNi.

14. The light detecting apparatus of claim 11, wherein the front surface pseudo-wiring is made from Al or Cu.

15. The light detecting apparatus of claim 14 further comprising a second barrier metal film that covers the front surface pseudo-wiring.

16. The light detecting apparatus of claim 15, wherein the second barrier metal film is made from Ti or TiNi.

17. The light detecting apparatus of claim 14, wherein the rear surface circuit wiring is made from Al or Cu and the rear surface pseudo-wiring is also made from Al or Cu.

18. The light detecting apparatus of claim 17 further comprising a third barrier metal film that covers the rear surface circuit wiring and a fourth barrier metal film that covers the rear surface pseudo-wiring.

19. The light detecting apparatus of claim 18, wherein each of the third and fourth barrier metal films is made from Ti or TiNi.

* * * * *